United States Patent [19]

Yamamoto

[11] Patent Number: 5,309,057
[45] Date of Patent: May 3, 1994

[54] WEIGHTED TRANSDUCER FOR SURFACE ACOUSTIC WAVE FILTER

[75] Inventor: Yasushi Yamamoto, Tokyo, Japan

[73] Assignee: NEC Corporation, Japan

[21] Appl. No.: 921,921

[22] Filed: Jul. 29, 1992

[30] Foreign Application Priority Data

Aug. 19, 1991 [JP] Japan .................................. 3-230824

[51] Int. Cl.$^5$ ............................................. H01L 41/08
[52] U.S. Cl. ................................................ 310/313 C
[58] Field of Search ........... 310/313 B, 313 C, 313 D; 333/150-154, 193-196

[56] References Cited

U.S. PATENT DOCUMENTS 4,604,595 8/1986 Kadota ....................... 310/313 C X

OTHER PUBLICATIONS

Herbert Matthews, "Surface Wave Filter", John Wiley & Sons, Inc., 1977, pp. vii-viii.
M. Hikita et al., "Phase Weighting for Low Loss Saw Filters", 1980 Ultrasonics Symposium, IEEE, pp. 308-316.

*Primary Examiner*—Mark O. Budd
*Attorney, Agent, or Firm*—Laff, Whitesel, Conte, Saret

[57] ABSTRACT

According to this invention, a weighted transducer for a surface acoustic wave filter includes first and second overlap transducer fingers. The first overlap fingers are formed on a surface of a piezoelectric substrate and have overlap widths continuously changed in a propagation direction of a surface acoustic wave. The second overlap transducer fingers are alternately adjacent to the first overlap transducer fingers in a longitudinal direction of the fist overlap transducer fingers, formed on the surface of the piezoelectric substrate to be electrically connected to each other in parallel and reverse-biased, and have overlap widths of the second overlap transducer fingers continuously changed in the propagation direction of the surface acoustic wave. A sum of the overlap widths of the first and second overlap transducer fingers is always set to be constant in the propagation direction of the surface acoustic wave.

3 Claims, 2 Drawing Sheets

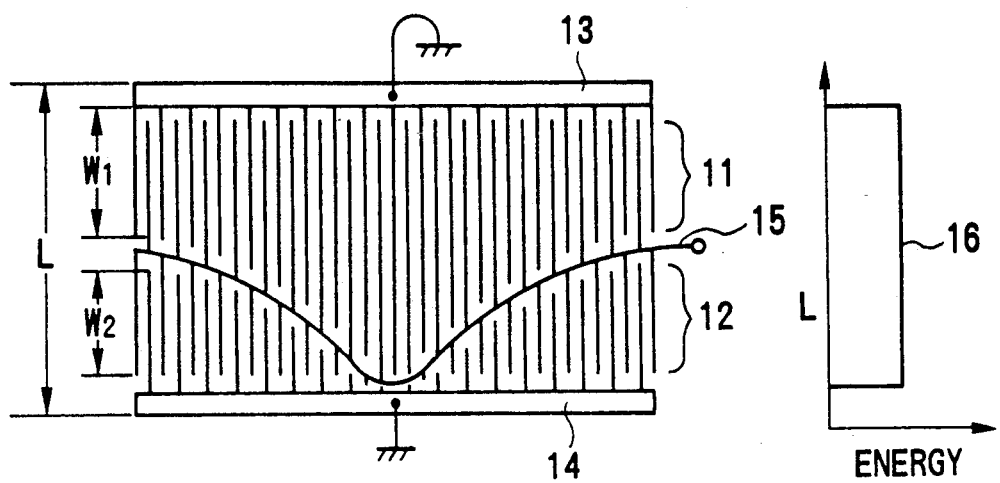
FIG.1A     FIG.1B
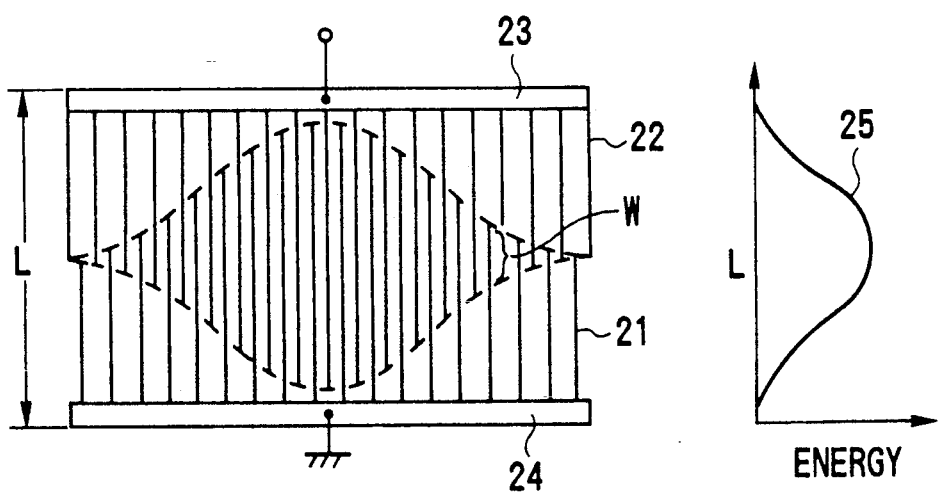
FIG.2A
PRIOR ART
FIG.2B
PRIOR ART

WEIGHTED TRANSDUCER FOR SURFACE ACOUSTIC WAVE FILTER

BACKGROUND OF THE INVENTION

The present invention relates to a weighted transducer applied to a surface acoustic wave filter.

In general, an SAW (Surface Acoustic Wave) filter is an element used for obtaining filter characteristics as follows. An IDT (interdigital transducer) which is obtained by properly weighting an excited intensity therein is arranged in a piezoelectric substrate surface, and an SAW is transmitted and received by the IDT. As a characteristic feature of the SAW filter, amplitude and phase characteristics can be arbitrarily and independently designed.

As a conventional weighted transducer used for a surface acoustic wave filter of this type, an apodized method is mainly used. As shown in FIG. 2A, according to the apodized method, overlap widths between transducer fingers 21 and 22 are locally changed in proportion to a weighting function. Note that reference numerals 23 and 24 denote bus bars to which the transducer fingers 22 and 21 are respectively connected.

As another arrangement of the weighted transducer used for the surface acoustic wave filter of this type, a withdrawal method is used in the same manner as described above. As shown in FIG. 3A, according to the withdrawal method, although an overlap width W between transducer fingers 31 and 32 is constant, the density of the transducer fingers 31 and 32 having the overlap width W is proportional to a weighting function. Note that reference numerals 33 and 34 denote bus bars to which the transducer fingers 32 and 31 are respectively connected.

FIGS. 2B and 3B show a surface acoustic wave energy distribution 25 in the apodized method and a surface acoustic wave energy distribution 35 in the withdrawal method, respectively. In FIGS. 2B and 3B, reference symbols L represent distances from the bus bars 24 and 34, respectively.

However, the above weighted transducers have drawbacks respectively inherent thereto and have been selectively used depending on applications. That is, in the apodized method shown in FIG. 2A and 2B, a weighting function can be faithfully represented by the overlap width W, and the filter characteristics of a portion having a small weighting function, i.e., a portion having a narrow overlap width W are easily degraded by an error caused by a diffraction effect. The energy distribution 25 excited from the transducer is not uniform due to the transverse distribution of weighting functions and causes a weighting loss.

In addition, in the withdrawal method shown in FIGS. 3A and 3B, although the excited energy distribution 35 is uniform, since weighting functions are expressed by a change in density caused by the presence/absence of the overlap width W between the transducer fingers 31 and 32 connected to the bus bars 34 and 33, respectively, a quantization error is larger than that of the apodized method, and desired characteristics cannot easily be obtained.

SUMMARY OF THE INVENTION

It is an object to provide a weighted transducer for a surface acoustic wave filter designed to reduce diffraction degradation and a weighting loss.

It is another object of the present invention to provide a weighted transducer for a surface acoustic wave filter in which desired characteristics can be obtained by decreasing an impedance of the weighted transducer.

In order to achieve the above objects, according to the present invention, there is provided a weighted transducer for a surface acoustic wave filter, comprising first overlap transducer fingers formed on a surface of a piezoelectric substrate and having overlap widths continuously changed in a propagation direction of a surface acoustic wave, and second overlap transducer fingers which are alternately adjacent to the first overlap transducer fingers in a longitudinal direction of the first overlap transducer fingers, formed on the surface of the piezoelectric substrate to be electrically connected to each other in parallel and reverse-biased, and have overlap widths of the second overlap transducer fingers continuously changed in the propagation direction of the surface acoustic wave, wherein a sum of the overlap widths of the first and second overlap transducer fingers is always set to be constant in the propagation direction of the surface acoustic wave.

BRIEF DESCRIPTION OF THE DRAWINGS

FIGS. 1A and 1B are views for explaining an arrangement of a weighted transducer for a surface acoustic wave filter according to an embodiment of the present invention;

FIGS. 2A and 2B are views for explaining an arrangement of an apodized transducer pattern serving as a conventional weighted transducer for a surface acoustic wave filter.

DESCRIPTION OF THE PREFERRED EMBODIMENT

Figures 3A, 3B:
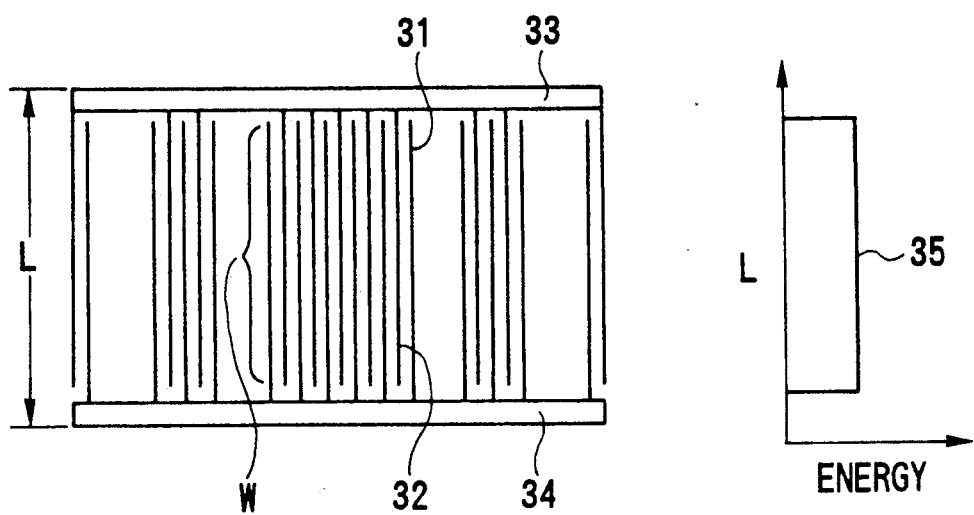
FIGS. 3A and 3B are views for explaining a withdrawal transducer pattern serving as a conventional weighted transducer for a surface acoustic wave filter.

An embodiment of the present invention will be described below with reference to the accompanying drawings.

FIGS. 1A and 1B explain an arrangement of a weighted transducer for a surface acoustic wave filter according the embodiment of the present invention. FIG. 1A shows the weighted transducer for a surface acoustic wave filter, and FIG. 1B shows a surface acoustic wave energy distribution. In FIG. 1A, reference numerals 11 and 12 denote two different sets of overlap transducer fingers. The hot terminals of the overlap transducer fingers 11 and 12 are connected to a common bus bar 15, and the ground terminals of the transducer fingers 11 and 12 are connected to bus bars 13 and 14, respectively, to be grounded, thereby electrically connecting the transducer fingers 11 and 12 in parallel and reverse-biasing them. That is, the odd-numbered transducer fingers of the overlap transducer fingers 11 and the even-numbered transducer fingers of the overlap transducer fingers 12 are connected to a bias source (not shown) as hot terminal transducer fingers by the common bus bar 15, and the even-numbered transducer fingers of the overlap transducer fingers 11 and the odd-numbered transducer fingers of the overlap transducer fingers 12 are grounded by the bus bars 13 and 14, respectively, as ground terminal transducer fingers. From FIG. 1A, it will be noted that fingers 11, 12 are aligned with each other and are in the same "excitation positions". That is, the energy is transmitted in a horizontal direction, as viewed in FIG. 1A. Since the fingers 11 are vertically aligned with the fingers 12 respectively, the transverse, energy propagation direction will excite the aligned fingers at the same time. A sum ($W_1+W_2$) or overlap widths $W_1$ and $W_2$ of the overlap transducer fingers 11 and 12 is set to be constant regardless of the positions of the overlap transducer fingers 11 and 12. In addition, the polarities of the overlap transducer fingers 11 and 12 are reversed to each other in a reverse-biased state with respect to the common bus bar 15, and the strength of a surface acoustic wave excited from the overlap widths $W_1$ and $W_2$ is proportional to ($W_1-W_2$). Therefore, as shown in FIG. 1B, a uniform surface acoustic wave energy distribution 16 can be obtained.

As described above, according to the present invention, although an overlap width is constant ($W_1+W_2$) regardless of positions, since the effective excitation strength of a surface acoustic wave is proportional to a difference in overlap widths of first and second overlap transducer fingers, degradation which is a drawback of a conventional apodized transducer and caused by a diffraction effect is very small, and there are no limits in design caused by a quantization error as in a conventional withdrawal transducer. Therefore, the present invention can be freely applied. In addition, a high impedance caused by a decrease in excitation effect due to a weighting operation cannot be inevitably prevented in a conventional technique. However, according to the present invention. since the first and second overlap transducer fingers are electrically connected to each other in parallel, an impedance can be maintained to be low. This is considerably effective to improve the performance of the surface acoustic wave filter.

What is claimed is:

1. A weighted transducer for a surface acoustic wave filter, comprising:

first overlap transducer fingers formed lengthwise on a surface of a piezoelectric substrate and having overlap widths which are continuously changed in a propagation direction of a surface acoustic wave; and second overlap transducer fingers which are formed lengthwise and alternatively arranged adjacent to said first overlap transducer fingers in a longitudinal direction of said first overlap transducer fingers, said second overlapped fingers being formed on the surface of said piezoelectric substrate and being electrically connected to each other in parallel and reverse-biased, overlapped widths of said second overlap transducer fingers being continuously changed in the propagation direction of the surface acoustic wave, said first and second overlap transducer being in the same relative positions to transmit a surface acoustic wave in a direction which is perpendicular to the lengthwise direction of the overlap transducer fingers, a sum of the overlap widths of said first and second overlap transducer fingers always being constant in the propagation direction of the surface acoustic wave.

2. An transducer according to claim 1, wherein odd-numbered transducer fingers of said first overlap transducer fingers and even-numbered transducer fingers of said second overlap transducer fingers are connected to each other as hot terminal transducer fingers, and even-numbered transducer fingers of said first overlap transducer fingers and odd-numbered transducer fingers of said second overlap transducer fingers are connected to each other as ground terminal transducer fingers.

3. An transducer according to claim 2, further comprising a common bus bar for commonly connecting said hot terminal transducer fingers, and a pair of bus bars for connecting said ground transducer fingers of said first and second overlap transducer fingers, respectively.

* * * * *